(12) United States Patent
Egashira et al.

(10) Patent No.: US 6,663,721 B2
(45) Date of Patent: Dec. 16, 2003

(54) LIQUID PROCESSING APPARATUS AND METHOD

(75) Inventors: Koji Egashira, Tosu (JP); Koji Tanaka, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 85 days.

(21) Appl. No.: 09/783,301

(22) Filed: Feb. 15, 2001

(65) Prior Publication Data

US 2001/0013555 A1 Aug. 16, 2001

(30) Foreign Application Priority Data

Feb. 15, 2000 (JP) ........................................ 2000-036811

(51) Int. Cl.$^7$ ............................. B08B 7/04; B08B 3/10
(52) U.S. Cl. .......................... 134/19; 134/18; 134/10; 134/34; 134/56 R; 134/57 R; 134/902; 134/105; 134/113
(58) Field of Search ................................. 134/105, 902, 134/26, 30, 19, 34, 10, 18, 107, 108, 56 R, 113, 57 R

(56) References Cited

U.S. PATENT DOCUMENTS

| | | | | |
|---|---|---|---|---|
| 5,158,100 A | * | 10/1992 | Tanaka et al. | 134/105 |
| 5,511,569 A | * | 4/1996 | Mukogawa | 134/104.1 |
| 5,538,025 A | * | 7/1996 | Gray et al. | 134/105 |

* cited by examiner

Primary Examiner—Alexander Markoff
(74) Attorney, Agent, or Firm—Smith, Gambrell & Russell, LLP

(57) ABSTRACT

A liquid processing apparatus is provided to improve its processing efficiency, together with a liquid processing method. The apparatus is capable of both reduction in temperature-variation of a processing liquid at processing and shortening for temperature-recovery of the processing liquid. Further, the liquid processing apparatus can facilitate the establishment of respective designated temperatures for different processes and carry out different processes continuously and effectively. The apparatus includes an inner cylinder 25 to accommodate semiconductor wafers W and a chemical supply unit 50 to supply the semiconductor wafers W in an inner cylindrical chamber 23 with a chemical liquid. The apparatus further includes a case heat exchanger 90 arranged in an outer peripheral position of the inner cylinder 25 and allowing a temperature-adjustment medium to flow and a medium supplier 100 to supply the regulator 90 with the temperature-adjustment medium.

17 Claims, 7 Drawing Sheets

LIQUID PROCESSING APPARATUS AND METHOD

BACKGROUND OF THE INVENTION

1. Technical Field of the Invention

The present invention relates to a liquid processing apparatus and a liquid processing method. More in detail, the invention relates to the liquid processing apparatus and method of applying a predetermined liquid-process (e.g. cleaning process using chemical liquids) on an object to be processed, for example, a semiconductor wafer, a LCD glass substrate, etc.

2. Description of the Related Art

In process of manufacturing semiconductor devices, LCD glasses, etc., a liquid processing apparatus (method) using processing liquids is widely employed in order to remove residuals (polymer etc.) after drying process or resists adhering to the objects to be processed, for example, semiconductor wafers, LCD glasses, etc. Note, in this specification, the objects will be referred as "wafers etc." hereinafter.

As the conventional liquid processing apparatus (method) of the above kind, a rotary liquid-processing apparatus (method) is also known. In this apparatus, a rotor carrying a plurality of wafers is accommodated in a processing chamber and then a processing liquid is supplied to the rotating wafers in order to clean them.

In accordance with the rotary liquid-processing apparatus (method), there can be accomplished a first process to clean the wafers etc. by supplying them with a processing (chemical) liquid; a second process to remove this chemical liquid by supplying another processing liquid (e.g. IPA); and a sequent drying process.

In the liquid processing method of this kind, meanwhile, it is desired to carry out the chemical process while using a chemical liquid of relatively-high temperature, for example, 80° C.

However, the above-mentioned rotary liquid-processing apparatus (method) has a problem that the temperature of the processing (chemical) liquid is extremely lowered to deteriorate the processing capability due to the supply of the processing liquid while rotating the wafers etc. Alternatively, in case of circulating the processing (chemical) liquid for use, it takes a lot of time to recover a target temperature of the liquid. Thus, there arises a problem that the processing efficiency is deteriorated.

As to the second process after the chemical process, when the above IPA etc. exhibiting high volatility is used as the other processing liquid, it is necessary to perform the second process while lowering a temperature of the atmosphere after the chemical process of high temperature. However, if it takes much of time to cool the atmosphere, then a problem arises in that the processing efficiency is deteriorated due to the elongation of "stand-by" period for the next-coming process.

SUMMARY OF THE INVENTION

Under the above-mentioned situation, the first object of the present invention resides in the provision of a liquid processing apparatus (also including the method) which are capable of both reduction in temperature-variation of the processing liquid at processing and shortening for temperature-recovery of the processing liquid thereby to improve the process efficiency. Additionally, the second object of the invention resides in the provision of the liquid processing apparatus (also including the method) which further facilitates the establishment of respective designated temperatures for different processes and which can carry out different processes continuously and effectively.

The first feature of the invention resides in a liquid processing apparatus for applying processing liquid on an object to be processed, comprising: a case; a processing chamber defined by the case to accommodate the object therein; a liquid supplier for supplying processing liquid to the object in the processing chamber; a case heat exchanger provided to the case and through which temperature-adjustment medium adjusted in temperature is able to flow and; a medium supplier connected with the case heat exchanger to supply the temperature-adjustment medium to the case heat exchanger.

With the constitution mentioned above, since it allows the temperature-adjustment medium to be supplied to the case heat exchanger outside the processing chamber by the medium supplier, it is possible to flow the temperature-adjustment medium about the outer periphery of the processing chamber at a process to supply the object with the processing liquid of a designated temperature. Consequently, the processing chamber including the interior of the chamber is controlled to be of a temperature of the processing liquid, reducing the change in temperature of the processing liquid, such as lowering or rising. Further, in case of circulating the processing liquid, it is possible to shorten a time for recovering the temperature of the processing liquid. Thus, the processing efficiency can be improved.

The second feature of the invention resides in that the medium supplier is connected with the case heat exchanger through switching device and also having a coolant source from which the temperature-adjustment medium as coolant is to be supplied.

The third feature of the invention resides in that the liquid processing apparatus of the second feature further comprises a controller for controlling switching operation of the switching device.

With the above-mentioned structure, it is possible to supply the case heat exchanger with the temperature-adjustment medium or the temperature-control cooling medium (coolant) selected by the switching operation of the switching means. Therefore, after completing the first process where the processing chamber including the interior of the chamber is controlled to be of a temperature of the processing liquid, it is possible to perform the second process to supply another processing liquid to the object while the processing chamber and the interior are together cooled by the flow of temperature-control cooling medium. Thus, it is possible to facilitate the establishment of respective designated temperatures for different process and also accomplish the different process continuously and effectively.

The fourth feature of the invention resides in a liquid processing apparatus for applying processing liquid on an object to be processed, comprising: a case; a holder for holding the object rotatably; a processing chamber surrounded by the case to accommodate the object and the holder therein; a liquid supplier for supplying processing liquid to the object in the processing chamber; and a case heat exchanger provided to the case.

The fifth feature of the invention resides in that temperature adjustment medium adjusted in temperature is able to flow through the case heat exchanger.

The sixth feature of the invention resides in that the processing chamber has a first processing chamber and a second processing chamber surrounding the first processing chamber; the case having a first case surrounding the first processing chamber and a second case surrounding the second processing chamber; the first case and the second case being constructed so as to be movable relatively; and the case heat exchanger being provided, at least, to the first case.

With the constitution mentioned above, since the interior of the processing chamber is adjusted in temperature by the case heat exchanger arranged about the outer periphery of the processing chamber, it is possible to minimize the temperature variations (lowering, rising, etc.) of the processing liquid in case of supplying the rotating object with the processing liquid of a designated temperature. Furthermore, in case of the supply of the processing liquid in circulation, then the above constitution allows a time for recovering the temperature of the processing liquid to be shortened.

The seventh feature of the invention resides in further comprising a medium supplier for supplying the temperature-adjustment medium to the case heat exchanger, whereby the temperature-adjustment medium supplied from the medium supplier flows through the case heat exchanger.

The eighth feature of the invention resides in further comprising a liquid temperature controller for controlling a temperature of the processing liquid in the liquid supplier, and resides in that the medium supplier has a medium-circulating pipeline passing through the case heat exchanger and a medium-circulating pump interposed in the medium circulating pipeline, whereby the temperature-adjustment medium flowing in the medium-circulating pipeline is adjusted in temperature by the liquid-temperature controller.

With the constitution mentioned above, at processing, it is possible to equalize the temperature of the processing liquid to the temperatures of the processing chamber and the interior of the chamber with ease.

The ninth feature of the invention resides in that the liquid supplier comprises: a liquid nozzle for ejecting the processing liquid into the processing chamber; a liquid reservoir for storing the processing liquid therein; a liquid supply pipeline for connecting the liquid reservoir with the liquid nozzle; and a liquid-temperature controller provided to the liquid reservoir to control temperature of the processing liquid stored in the liquid reservoir.

Since the liquid supplier comprises a liquid nozzle for ejecting the processing liquid into the processing chamber, a liquid reservoir for storing the processing liquid therein, a liquid supply pipeline for connecting the liquid reservoir with the liquid nozzle and a liquid-temperature regulator arranged in the liquid reservoir to control a temperature of the processing liquid stored in the liquid reservoir, the liquid-temperature regulator allows the processing liquid in the liquid reservoir to be controlled to a designated temperature. Additionally, it is possible to supply the processing liquid into the processing chamber through the liquid nozzle.

The tenth feature of the invention resides in that the liquid reservoir has an inner tank, an outer tank arranged outside the inner tank and also provided with the liquid-temperature controller and a medium circulating pipeline disposed between the outer tank and the inner tank so as to transfer heat between the processing liquid in the outer tank and the temperature-adjustment medium in the medium circulating pipeline.

In this case, since the liquid reservoir has an inner tank, an outer tank arranged outside the inner tank and also provided with the liquid-temperature regulator and a heat exchanger disposed between the outer tank and the inner tank and also connected with the medium-circulating pipeline of the medium supplier, it is possible to use a space for the apparatus effectively and also possible to equalize the temperature-adjustment medium with the processing liquid in temperature.

The eleventh feature of the invention resides in that the case heat exchanger have a meandering pipe arranged outside the case meanderingly and a spacer member disposed between the meandering pipe and an outer surface of the case; the spacer member being made of heat conductive material; and the spacer member having a first surface being in contact with the meandering pipe and shaped to be a cylindrical sidewall so as to be in contact with an outer face of the meandering pipe and a second surface being in contact with an outer face of the case and shaped to be a cylindrical sidewall so as to be contoured along the outer surface of the case.

The twelfth feature of the invention resides in that the meandering pipe is overlaid with a thermal insulating sheet.

The above-mentioned structure allows the heat of the temperature-adjustment medium or cooling medium flowing in the meandering pipe to be transmitted to the outer face of the processing chamber and the interior of the chamber through the spacer member effectively. Owing to the provision of the thermal insulating sheet, the heat loss of the case heat exchanger can be restricted to enhance the thermal insulating effect furthermore.

The 13th feature of the invention resides in a liquid processing method of applying a process on an object to be processed by supplying processing liquid to the object accommodated in a processing chamber surrounded by a case, the liquid processing method comprising the step of: making a temperature-adjustment medium adjusted in temperature flow to the outer surface of the case thereby to control temperature of the processing chamber, at the time when the processing liquid is supplied to the object accommodated in the processing chamber.

According to the 13th feature of the invention, it is possible to flow the temperature-adjustment medium about the outer periphery of the processing chamber at a process to supply the object with the processing liquid of the designated temperature. Consequently, the processing chamber including the interior of the chamber is controlled to be of a temperature of the processing liquid, reducing the change in temperature of the processing liquid, such as lowering or rising. Further, in case of circulating the processing liquid, it is possible to shorten a time for recovering the temperature of the processing liquid. Thus, the processing efficiency can be improved.

The 14th. feature of the invention resides in a liquid processing method of applying a process on an object to be processed by supplying processing liquid to the object accommodated in a processing chamber surrounded by a case, the liquid processing method comprising the step of: making a temperature-adjustment medium flow into a case heat exchanger provided to the case thereby to control temperature of the processing chamber, at the time of a first process when the processing liquid is supplied to the object accommodated in the processing chamber; stopping to supply the processing liquid and stopping the flow of the temperature-adjustment medium in the case heat exchanger; and supplying the object with another processing liquid thereby to apply a second process on the object.

The 15th. feature of the invention resides in further comprising the step of making the temperature of the processing chamber adjusted by supplying the temperature-adjustment medium, before the first process start According to the 14th. feature of the invention, with the above-mentioned steps, it is possible to facilitate the establishment of respective designated temperatures for different processes and also accomplish the different processes continuously and effectively. Furthermore, owing to the flowing of the temperature-adjustment medium through the case heat exchanger, it is possible to improve the temperature-regulating efficiency.

The 16th feature of the invention resides in further comprising the step of making a temperature-adjustment medium for cooling pass through the case heat exchanger thereby to cool the processing chamber.

In this case, it is possible to cool the processing chamber (including the interior) that has been controlled to a designated temperature, with ease.

The 17th. feature of the invention resides in a liquid processing method of applying a process on an object to be processed by supplying processing liquid to the object accommodated in a processing chamber, the liquid processing method comprising the step of: controlling temperature of the processing chamber at a first process to supply the processing liquid of a predetermined temperature to the object accommodated in the processing chamber; stopping the supply of the processing liquid and simultaneously stopping the control of temperature of the processing chamber; cooling an interior of the processing chamber adjusted in temperature; and supplying the object with another processing liquid thereby to apply a second process on the object.

Also in this case, it is possible to facilitate the establishment of respective designated temperatures for different processes and also accomplish the different processes continuously and effectively. Then, as the temperature-adjustment medium (means), there may be used temperature-controlled water, heated inert gas (e.g. $N_2$ gas), a heater, etc. As the cooling medium (means), for example, there may be used cooled water, inert gas (e.g. $N_2$ gas)of a normal temperature, and so on.

The 18th. feature of the invention resides in that the processing chamber is controlled so as to have the same temperature as the predetermined temperature of the processing liquid.

In this case, it is possible to reduce the change in temperature of the processing liquid furthermore, improving the processing efficiency.

The 19th. feature of the invention resides in that the processing liquid is supplied to the rotating object.

Also in this case, it is possible to reduce the change in temperature of the processing liquid in supplying the rotating object with the processing liquid. Thus, the processing efficiency of the liquid processing method can be improved furthermore.

The above and other features and advantages of this invention will become apparent, and the invention itself will best be understood, from a study of the following description and appended claims, with reference had to the attached drawings showing preferred embodiments of the invention.

DESCRIPTION OF THE PREFERRED EMBODIMENT

With reference to drawings, one embodiment of the present invention will be described below. Throughout the embodiments, the present invention is applied to a cleaning-and-drying apparatus for semiconductor wafers.

Figure 1:
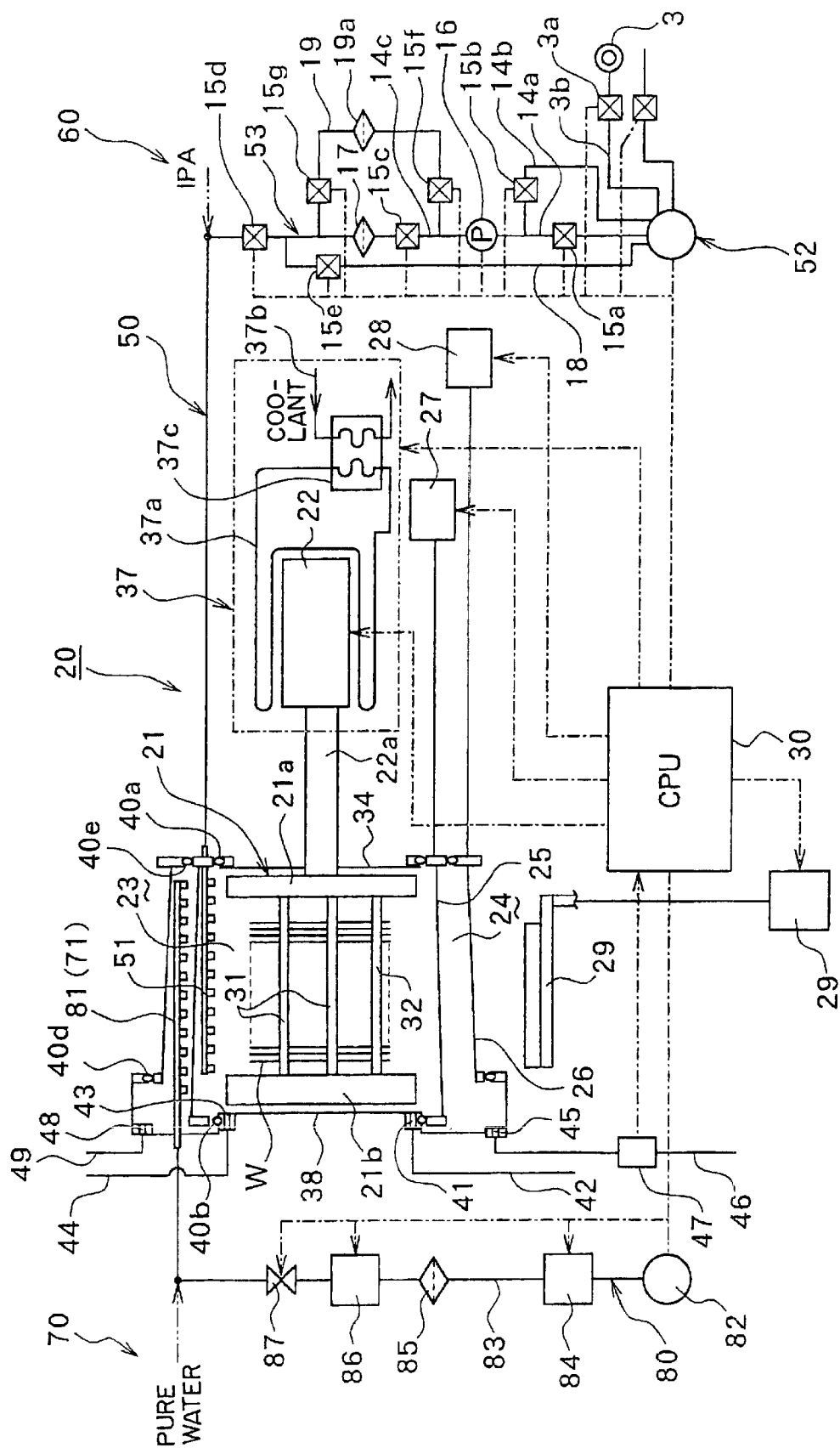
FIG. 1 is a schematically structural view of a cleaning-and-drying apparatus that the liquid processing apparatus of the present invention is applied.

FIG. 1 illustrates the schematic structure of the cleaning-and-drying apparatus as a result of the application of a liquid processing apparatus of the present invention.

The above liquid processing apparatus 20 includes, as main constituents, a rotatable holder (e.g. rotor 21) for carrying wafers W as the objects to be processed; a motor 22 as drive means for rotating the rotor 21 about a horizontal axis; and a plurality of processing chambers for accommodating the wafers W carried by the rotor 21. In the shown embodiment, the processing chambers are identical to an inner chamber (first chamber) 23 and an outer chamber (second chamber) 24.

The liquid processing apparatus 20 further includes a chemical supply unit 50, a solvent supply unit 60, a rinse supply unit 70 and a dry fluid supply unit 80. The chemical supply unit 50 serves to supply a first processing (chemical) liquid, for example, resist removing liquid (i.e. resist stripper), polymer removing liquid (polymer remover), etc. to the wafers W accommodated in the inner chamber 23 or the outer chamber 24. The solvent supply unit 60 serves to supply a second processing liquid (e.g. isopropyl alcohol) as a solvent for the above chemical liquid to the wafers W The rinse supply unit 70 serves to supply a rinsing liquid, for example, pure water (demineralized water) to the wafer W. The dry fluid supply unit 80 serves to supply a dry gas, for example, inert gas (e.g. $N_2$-gas), fresh air, etc. to the wafers W Additionally, the liquid processing apparatus 20 has a moving mechanism for moving an inner cylinder 25 defining the inner chamber 23 therein and an outer cylinder 26 defining the outer chamber 24 therein. For example, the moving mechanism consists of a first cylinder 27 and a second cylinder 28 which respectively move the inner cylinder 25 and the outer cylinder 26 between their surrounding positions to surround or accommodate the wafers W therein and their stand-by positions apart from the surrounding positions. The liquid processing apparatus 20 further includes an object-delivery mechanism, for example, a wafer delivery hand 29 which delivers the wafers W from a not-shown wafer transfer chuck (or wafer carrier) to the rotor 21 and also delivers the wafers W in the opposite direction.

In the liquid processing apparatus 20, the motor 22, the above supply units 50, 60, 70, 80, the wafer delivery hand 29, etc. are all controlled by a control unit, for example, a central processing unit (CPU) 30.

Being coupled to a horizontal drive shaft 22a of the motor 22 like a cantilever, the rotor 21 is capable of carrying the wafers W while directing their surfaces perpendicularly and also rotatable about the horizontal axis. The rotor 21 comprises a first rotary disc 21a having a rotating shaft (not shown) connected with the drive shaft 22a of the motor 22 through a not-shown coupling, a second rotary disc 21b opposing the first rotary disc 21a, a plurality of immovable carrying rods 31 (e.g. four rods) built between the first rotary disc 21a and the second rotary disc 21b, and a pair of movable carrying rods 32 for supporting the lower parts of the wafers W retained by retaining grooves (not shown) formed on the rods 31 in succession. The movable carrying rods 32 are movable to occupy their pushing positions and non-pushing positions by means of not-shown locking and delocking mechanisms. The motor 22 is controlled so as to rotate at predetermined high speed and low speed selectively and repeatedly, on the basis of a program stored in the CPU 30 in advance. A cooling unit 37 is provided to prevent the motor 22 from overheating. The cooling unit 37 includes a cooling pipe 37a, a coolant supply pipe 37b and a heat exchanger 37c (see FIG. 1).

On the other hand, the processing chamber, for example, the inner chamber 23 (first processing chamber) is defined by a first stationary wall 34, a second stationary wall 38 opposing the first stationary wall 34 and an inner cylinder 25 engaging with the first and second stationary walls 34, 38 through a first and second sealing members 40a, 40b, respectively. That is, owing to the expansion of the first cylinder 27 as the moving mechanism, the inner cylinder 25 is moved up to the position to surround the wafers W together with the rotor 21. At this position, the inner cylinder 25 is sealed to the first stationary wall 34 through the first sealing member 40a and also sealed to the second stationary wall 38 through the second sealing member 40b, defining the inner chamber 23 (first processing chamber). While, owing to the shrinkage of the first cylinder 27, the inner cylinder 25 can be moved to an outer peripheral position (stand-by position) of a fixed cylinder (not shown). In the stand-by position, the opening at the leading end of the inner cylinder 25 is sealed to the first stationary wall 34 through the first sealing member 40a. Simultaneously, the inner cylinder 25 has its base end sealed to an intermediate portion of the above fixed cylinder through a third sealing member (not shown), so that an atmosphere of the chemical liquid left in the inner chamber 23 can be prevented from leaking out. Note, the inner cylinder 25 is made from stainless steel members abounding in chemical resistance and strength resistance. Further, when the inner cylinder 25 is made from stainless steel coated or pasted with fluororesin (e.g. PTFE, PFA) or made of such fluororesin itself, the thermal insulation of the cylinder 25 can be improved advantageously.

Similarly, owing to the expansion of the second cylinder 28, the outer cylinder 26 is moved up to the position to surround the wafers W and the rotor 21. At this position, the outer cylinder 26 is sealed to the second stationary wall 38 through the fourth sealing member 40d and also sealed to the inner cylinder 25 through the fifth sealing member 40e, defining the outer chamber 24 (second processing chamber). While, owing to the shrinkage of the second cylinder 28, the outer cylinder 26 can be moved to the outer peripheral position (stand-by position) of the above fixed cylinder. In the stand-by position, the fifth sealing member 40e is interposed between the base end of the outer cylinder 26 and that of the inner cylinder 25. That is, since the atmosphere of the inner chamber 23 is separated from the atmosphere of the outer chamber 24 in a fluid-tight manner, there is no possibility of mixing the atmosphere of the chamber 23 with that of the chamber 24, preventing the occurrence of cross-contamination of different processing liquids. Note, the outer cylinder 26 is also made from stainless steel members abounding in chemical resistance and strength resistance. Similarly to the inner cylinder 25, if the outer cylinder 26 is made from stainless steel coated or pasted with fluororesin (e.g. PTFE, PFA) or made of such fluororesin itself, then it is possible to improve the thermal insulation of the cylinder 25 advantageously.

The so-constructed inner and outer cylinders 25, 26 are taper-shaped so as to enlarge to their tips, respectively. Thus, owing to the taper-configuration of the cylinders 25, 26, an atmospheric current resulting from the rotation of the rotor 21 flows toward the enlarged side of the inner cylinder 25 or the outer cylinder 26 spirally, facilitating the discharge of inside chemical liquids etc. Additionally, owing to the coaxial arrangement of the inner cylinder 25 and the outer cylinder 26, it is possible to save the installation space for the inner and outer cylinders 25, 26 and the inner and outer chambers 23, 24, accomplishing the miniaturization of the apparatus.

Figure 2:
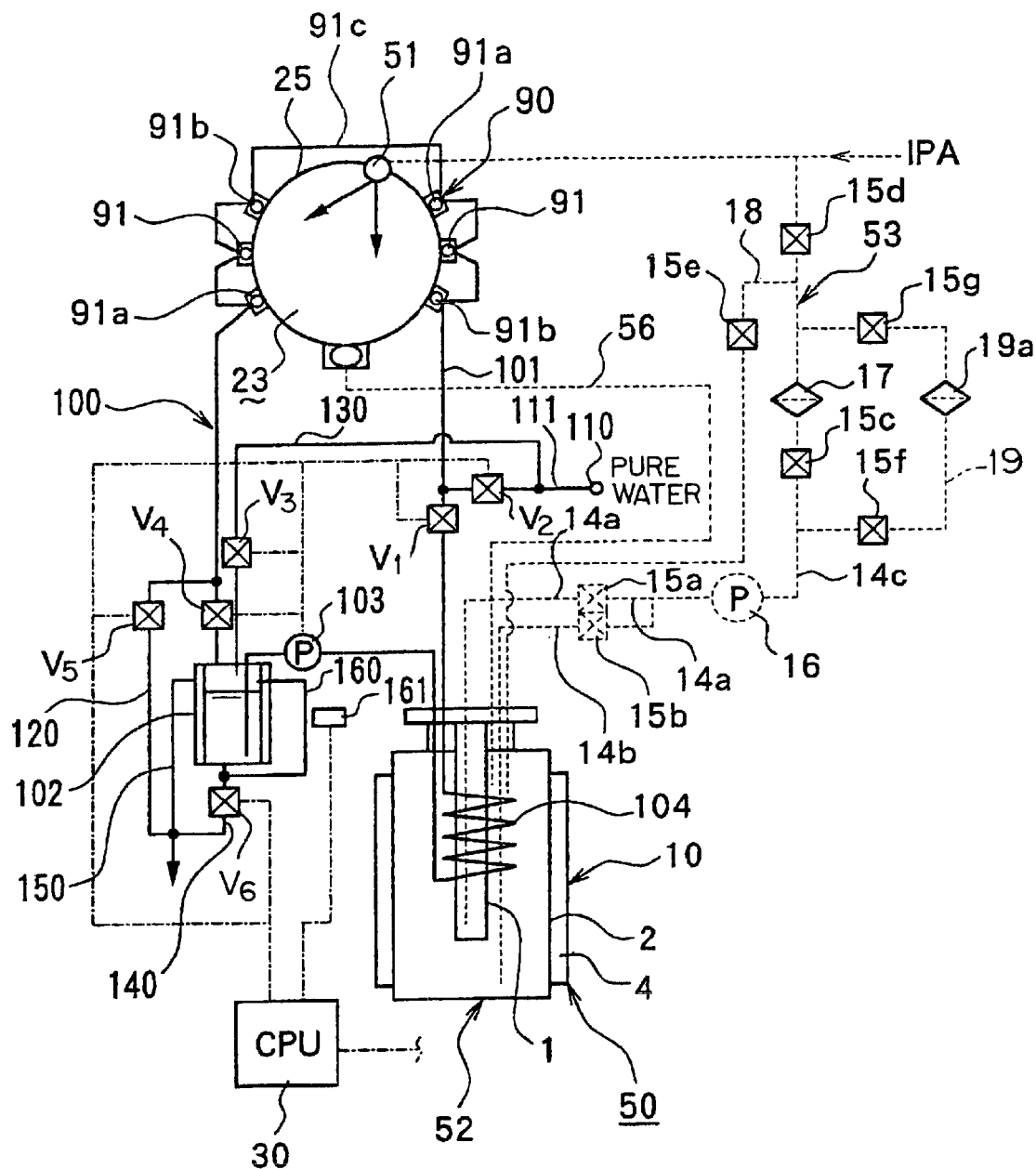
FIG. 2 is a schematic structural view showing an essential part of the liquid processing apparatus.

As shown in FIGS. 1 and 2, the chemical supply unit 50 includes a chemical supply nozzle 51, a chemical reservoir 52 and a chemical supply line 53 connecting the chemical supply nozzle 51 with the chemical reservoir 52.

Figure 3:
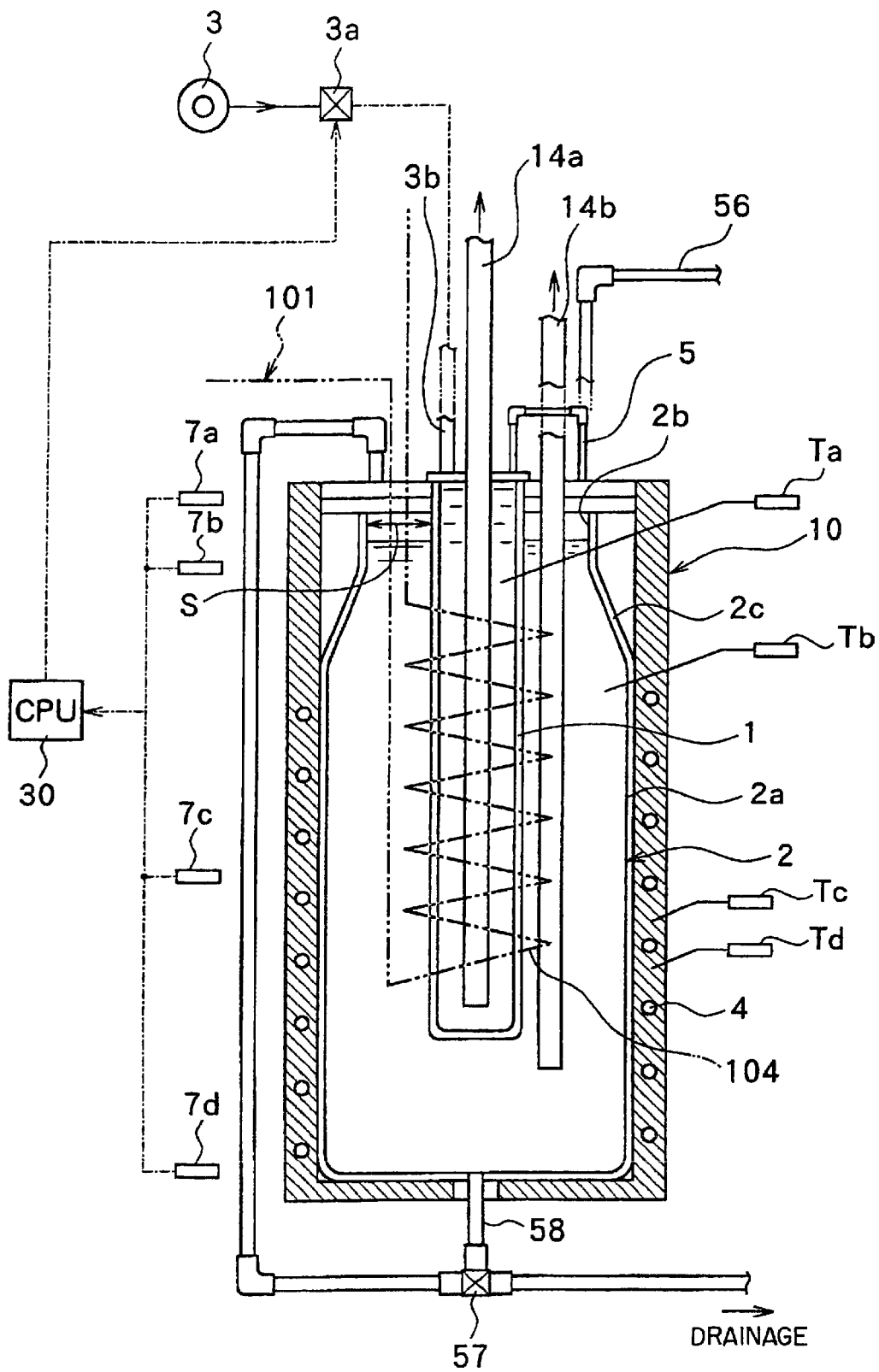
FIG. 3 is a sectional view showing a processing liquid reservoir and a liquid temperature controller of the liquid processing apparatus.

As shown in FIGS. 2 and 3, the chemical reservoir 52 is mainly formed by the chemical source 3 and the tank 10 that stores a new chemical liquid supplied from the source 3 and the chemical liquid after the processing.

The tank 10 consists of an inner tank 1 and an outer tank 2 for accommodating the inner tank 1, providing a tank of double structure. In order to store a new liquid, the inner tank 1 is connected with the chemical source 3 through a chemical pipeline 3b including a chemical valve 3a. The inner tank 1 is formed by a stainless container in the form of a bottomed cylinder. The outer tank 2 is also formed by a stainless container in the form of a bottomed cylinder. This bottomed cylinder has a cylindrical part 2a of a large diameter, an opening 2b of a small diameter and a tapered shoulder part 2c extending from the opening 2b to the cylindrical part 2a. The reason of providing the tapered shoulder part 2c is to prevent air bubbles from staying on the shoulder part 2c in process of filling the opening 2b with the chemical liquid. On the outer peripheral face of the outer tank 2, a heater 4 is arranged so as to surround the outer tank 2.

On the upper end of the inner tank 1, an overflow pipeline 5 is arranged to supply the chemical liquid overflowing from the inner tank 1 into the outer tank 2 (see FIG. 3). Therefore, after the inner tank 1 has been filled up with the new chemical liquid being supplied from the chemical source 3, the same liquid is supplied into the outer tank 2 through the overflow pipeline 5. As shown in FIG. 3, there is defined a narrow clearance S between the inner tank 1 and the opening 2b of the outer tank 2. It is desirable to form the clearance S as narrow as possible, if only having an area enough to detect a liquid surface of the chemical liquid stored in the outer tank 2. The reason is that since the narrower the clearance S between the inner tank 1 and the outer tank 2 is formed the less a contact area of the chemical liquid with fresh air is defined, it is possible to restrict the chemical liquid from being reacted or deteriorated in chemical thereby to maintain both quality and performance of the chemical liquid.

Respectively connected to each opening of the inner tank 1 and the outer tank 2 are a purge-gas pipeline and an exhaust pipeline (both not shown) which prevent the atmospheres from being changed by the exposure of the chemical liquids in the tanks 1, 2 to the fresh air. With the arrangement, a purge gas, for example, $N_2$ gas is supplied through the purge-gas pipeline connected to a not-shown purge-gas source. Note, in the vicinity of the outer tank 2, there are arranged an upper limit sensor 7a (e.g. capacitance-type sensor, light-transmission type sensor), a quantity sensor 7b, a heater-off sensor 7c and a lower limit sensor 7d, all of which are connected to the CPU 30. In operation, the upper limit sensor 7a and the lower limit sensor 7d detect upper and lower limits of the chemical liquid stored in the outer tank 2, respectively. The quantity sensor 7b detects the quantity of the chemical liquid actually stored in the outer tank 2. The heater-off sensor 7c detects the quantity of the chemical liquid that can be heated by the heater 4. On the upper end of the inner tank 1, there is arranged a not-shown fill-up sensor by which it is possible to monitor the condition of a chemical liquid flowing from the inner tank 1 to the outer tank 2. Thus, since the operation of the chemical valve 3a is controlled by the CPU 30 on the ground of respective detection signals from the fill-up sensor and the quantity sensor, it is possible to manage the quantities of the chemical liquids in the inner tank 1 and the outer tank 2.

The chemical liquid in the inner tank 1 and the same in the outer tank 2 can be heated or controlled in temperature, by the heater 4 outside the outer tank 2. In the control, the temperature of the chemical liquid in the inner tank 1 is detected by a temperature sensor Ta, while the temperature of the chemical liquid in the outer tank 3 is detected by a temperature sensor Tb. The temperature of the heater 4 is detected by a control-temperature sensor Tc and also an overheat-temperature sensor Td. Thus, the provision of the temperature sensors Ta-Td allows both temperature of the chemical liquid in the tank 2 and temperature of the heater 4 to be set to designated temperatures, respectively.

As shown in FIGS. 1 and 2, the chemical supply line 53 connecting the chemical supply nozzle 51 with the chemical reservoir 52 comprises a first pipeline 14a for supplying the chemical liquid in the inner tank 1 to the processing chamber, a second pipeline 14b for supplying the chemical liquid in the outer tank 2 to the processing chamber and a main pipeline 14c as a result of integration of the pipelines 14a, 14b. A first switching valve 15a is interposed in the first pipeline 14a, while a second switching valve 15b is interposed in the second pipeline 14b. The main pipeline 14c is equipped with a diaphragm-type pump 16. On the downstream side of the pump 16, a third switching valve 15c, a filter 17 and a fourth switching valve 15d are interposed in the pipeline 14c, in order.

The discharge side of the pump 16 is communicated with the outer tank 2 through a circulating pipeline 18 equipped with a fifth switching valve 15e, allowing the chemical liquid from the outer tank 2 to be circulated.

Between the pump 16 and the third switching valve 15c, a by-pass pipeline 19 is connected to the main pipeline 14c. The by-pass pipeline 19 is also connected to the main pipeline 14c between the discharge side of the third switching valve 15c and the connection with the circulating pipeline 18. In the by-pass pipeline 19, there are interposed a sixth switching valve 15f, a filter 19a and a seventh switching valve 15g in succession. Additionally, the opening 2b of the outer tank 2 is communicated with the processing chamber through a chemical return pipeline 56 allowing the chemical liquid, which has been supplied for the process in the processing chamber, to be stored in the outer tank 2 for recycling.

With the formation of the chemical supply line 53 mentioned above, it is possible to supply the processing chamber with the chemical liquid stored in the outer tank 2, through the second pipeline 14b, the main pipeline 14c, the by-pass pipeline 19 and the main pipeline 14c again, successively. Further, the chemical liquid (new) stored in the inner tank 1 can be supplied into the processing chamber through the first pipeline 14a and the main pipeline 14c. During the stand-by mode for processing the wafers W, it is possible to circulate the chemical liquid stored in the outer tank 2 through the circulating pipeline 18.

Note, the bottom of the outer tank 2 is connected to a drain pipeline 58 equipped with a drain valve 57 (see FIG. 3).

On the other hand, as shown in FIG. 2, a case heat exchanger 90 is arranged about the outer peripheral face of the first processing chamber, i.e. the inner cylinder 25. The case heat exchanger 90 is connected with a supply unit 100 to supply a temperature-adjustment medium, for example, hot water. The supply unit 100 will be referred to "hot-water supply unit", hereinafter. Additionally, a pure water source 110 is connected with the case heat exchanger 90 to supply a temperature-adjustment coolant, for example, pure water.

Figure 4:
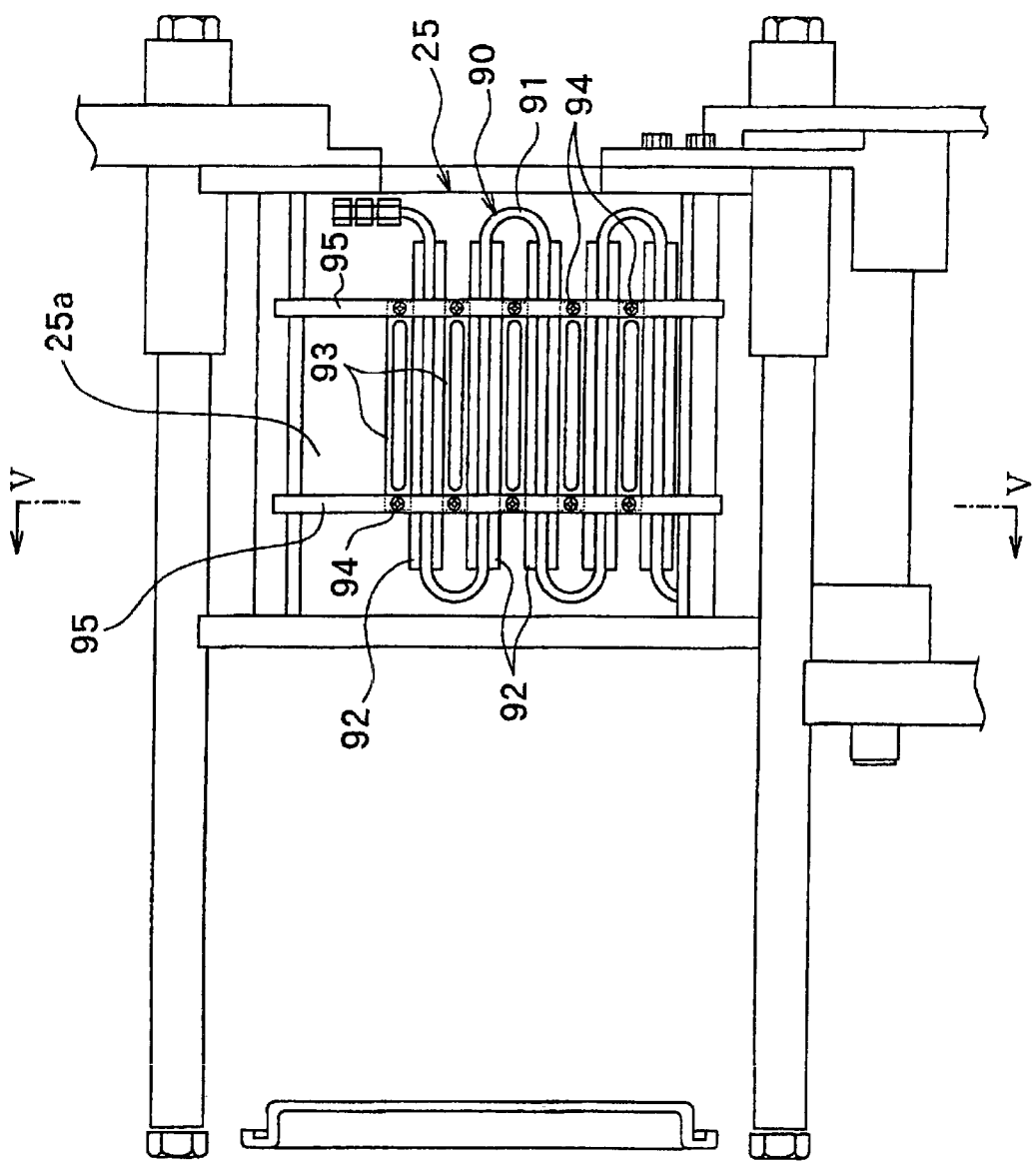
FIG. 4 is a side view showing the attachment of a meandering pipe for a case heat exchanger of the liquid processing apparatus.
Figure 5:
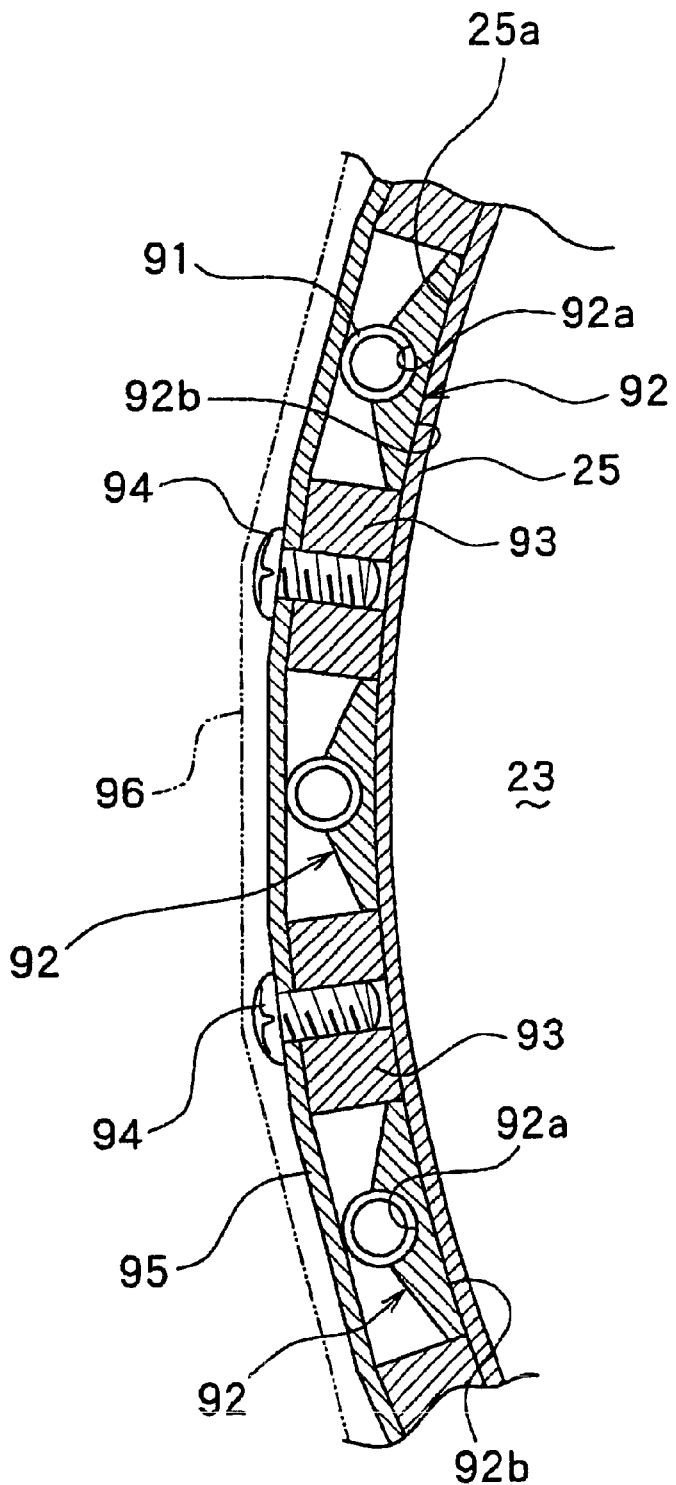
FIG. 5 is an elongated sectional view taken along a line V—V of FIG. 4.
Figure 6:
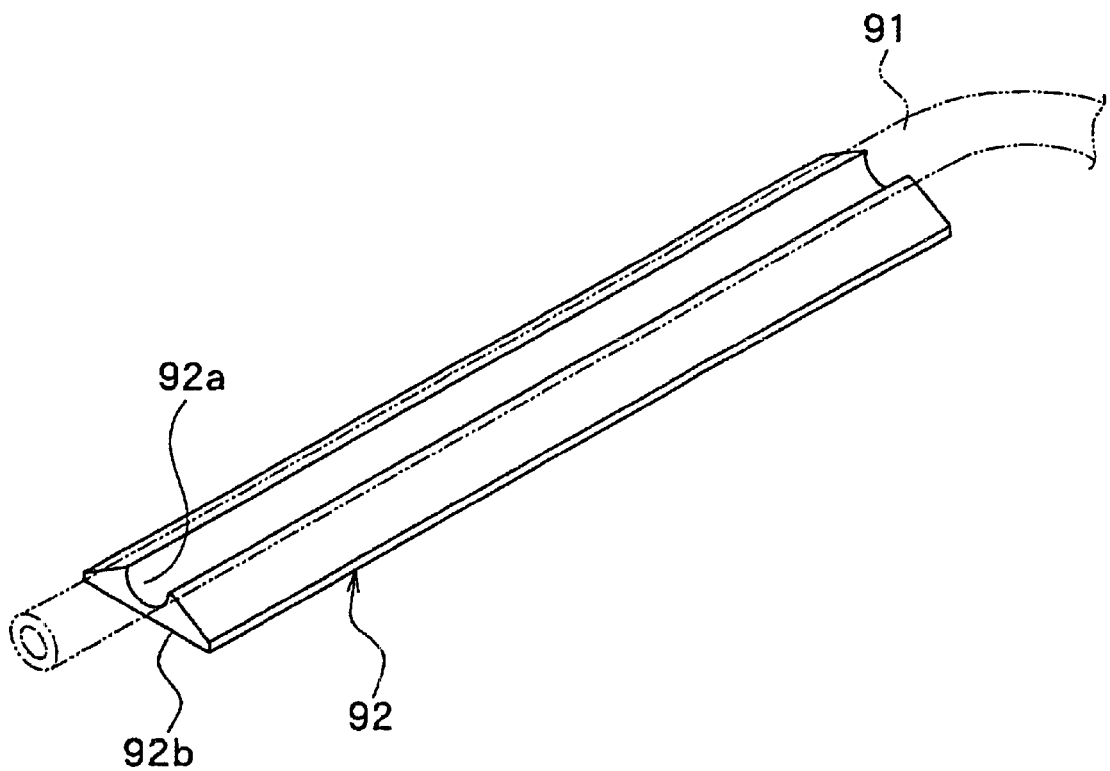
FIG. 6 is a perspective view of a spacer member of the case heat exchanger.

As shown in FIGS. 4 and 5, the case heat exchanger 90 has a meandering pipe 91 arranged outside the inner cylinder 25 meanderingly and also made of thermal conductive material, such as stainless steel, and spacer members 92 interposed between the meandering pipe 91 and the outer peripheral face 25a of the outer cylinder 25. In the shown embodiment, the meandering pipe 91 is secured on the outer face of the outer cylinder 25 by pusher plates 95. The pusher plates 95 are also fixed to mount blocks 93 by means of screws 94. Each mount block 93 is provided with a long hole and also interposed between the adjoining spacer members 92. The spacer members 92 are made of thermal conductive material, such as stainless steel. As shown in FIGS. 5 and 6, the meandering pipe 91 has a circular face 92a in contact with the outer face of the meandering pipe 91 and an expanded face 92b in contact with the outer face 25a of the inner cylinder 25. Note, the meandering pipe 91 is divided into two pieces on the left and right sides of the outer face 25a of the inner cylinder 25, so that an outflow port 91a of the pipe 91 (one piece) is connected to an inflow port 91b of the pipe 91 (the other piece) through a communication pipe 91c.

In this way, owing to the above-mentioned arrangement and formation of the spacer members 92, it is possible to transmit the heat of the temperature-adjustment medium (hot water) or coolant (pure water) flowing through the meandering pipe 91, to the inner cylinder 25 and also the interior of the inner chamber 23 (the first processing chamber) effectively. Thus, it is possible to enhance the efficiency in controlling the temperature.

The meandering pipe 91 is overlaid with a thermal insulating sheet 96 (see FIG. 5). Consequently, with the reduction of heat loss to the outside, it is possible to improve the "temperature-control" efficiency of the case heat exchanger 90 furthermore.

As shown in FIG. 2, the supply unit 100 has a circulating pipeline 101 connected to the inflow port 91b and the outflow port 91a of the meandering pipe 91 forming the regulator 90. Between the outflow port 91a and the inflow port 91b, there are successively interposed a reservoir 102, a circulating pump 103 and a first switching valve V1 as the first switching means. Between the circulating pump 103 and the first switching valve V1, the circulating pipeline 101 is partially arranged in the tank 10 forming the chemical reservoir 52. In detail, as shown in FIGS. 2 and 3, the circulating pipeline 101 is partially coiled round the inner tank 1 to form a heat exchanging part 104 between the inner tank 1 and the outer tank 2. In connection, it is desirable to form the heat exchanging part 104 by a stainless pipe abounding in chemical resistance and strength resistance. Additionally, it is also preferable to form the following joints by synthetic (e.g. PFA) pipes exhibiting chemical resistance and flexibility strength resistance, in view of facilitating the worker's connecting operation. One joint is positioned between a pure water pipeline 111 for connecting the pure water source 110 with the circulating pipeline 101 and the meandering pipe 91 (on the side of the inflow port 91b). Another joint is arranged between the meandering pipe 91 (on the side of the outflow port 91a) and a drain pipeline 120 described later.

In this way, since the part of circulating pipeline 101 forming the supply unit 100 is arranged between the inner tank 1 and the outer tank 2 of the tank 10 forming the chemical reservoir 52 thereby to provide the heat exchanging part 104, the heater 4 as the liquid-temperature regulator allows the chemical liquid in the tank 10 to be controlled (heated) into a designated temperature and simultaneously allows the temperature-adjustment medium (hot water) to be heated into a temperature (e.g. 80° C.) equal to the temperature of the chemical liquid. That is, it is possible to equalize the chemical liquid with the temperature-adjustment medium (hot water) in temperature by the single liquid-temperature regulator (heater 4), being accompanied with the reduction in number of constituents.

The pure water source 110 is connected with the circulating pipeline 101 between the first switching valve V1 and the meandering pipe 91 (the side of the inflow port 91b) through the pipeline 111 for pure water (temperature-adjustment coolant) equipped with the second switching valve V2 (second switching means). The second switching valve V2 and the first switching valve V1 are controlled by the CPU 30. By manipulating the valves V1 and V2 through the CPU 30, the temperature-adjustment medium (hot water) and coolant (pure water) are selectively supplied into the meandering pipe 91 of the case heat exchanger 90. In connection, the first switching valve V1 and the second switching valve V2 may be integrated into one structure and further interposed in a connection between the circulating pipeline 101 and the pure water pipeline 111.

The pure water pipeline 111 on the inflow side (primary side) of the second switching valve V2 is communicated with the reservoir 102 through a supplement pipeline 130 equipped with a valve V3. With this arrangement, the pure water as supplement can be fed into the reservoir 102.

A valve V4 is interposed in the circulating pipeline 101 on the inflow (primary) side of the reservoir 102. The pipeline 101 on the inflow side of the valve V4 is connected with the drain pipeline 120. The drain pipeline 120 is joined to a drain pipeline 140 connected with the bottom of the reservoir 102 and also another drain pipeline 150 connected with the top of the reservoir 102, allowing unnecessary medium (hot water) to be discharged to the outside. Note, the drain pipeline 120 is equipped with a valve V5, while the drain pipeline 120 is equipped with a valve V6. Outside the reservoir 102, there is arranged a level detecting pipe 160 in communication with the reservoir 102. Additionally, a level detecting sensor 161 (e.g. capacitance-type sensor, light-transmission type sensor) is arranged in the vicinity of the pipe 160. The detection signal from the sensor 161 is transmitted to the CPU 30. The valve V3 in the supplement pipeline 130 is controlled by control signals from the CPU 30 inputting the above detection signal. In this way, the temperature-adjustment medium (hot water) in the reservoir 102 is always maintained within a predetermined range of quantity. In connection, the circulating pipeline 101 connected to the outflow (secondary) side of the reservoir 102 is inserted into the vicinity of the bottom of the reservoir 102, preventing air from entering into the temperature-adjustment medium (hot water) flowing out of the reservoir 102. That is, owing to the quantity control in the reservoir 102 by means of the level detecting sensor 161 and the arrangement of the pipeline 101 in the reservoir 102, there can be defined an air-removing mechanism to remove the air from the hot water flowing in the circulating pipeline 101. Note, the above valves V3, V4 and the drain valve V6 are also controlled by the CPU 30, so that a surplus hot water in excess of the above predetermined range and the hot water in the reservoir 102 can be discharged.

The outer chamber 24 is provided, on its lower part on the expanded side, with a second drain port 45 to which a second drain pipe 46 containing a not-shown valve is connected. A ratio resistance meter 47 is interposed in the second drain pipe 46 in order to detect a ratio resistance value of the pure water supplied for rinsing. The so-detected ratio resistance value of pure water is transmitted to the CPU 30, in form of signals. Thus, since the rinsing situation is monitored by the ratio resistance meter 47, it is possible to stop the rinsing operation upon completion of the appropriate rinsing process.

Note, the outer chamber 24 is also provided, on its upper part on the expanded side, with a second exhaust port 48 to which a second exhaust pipe 49 containing a not-shown valve is connected.

As shown in FIG. 1, the dry fluid supply unit 80 includes a dry fluid nozzle 81 attached to the second stationary wall 38, a dry fluid (e.g. nitrogen-$N_2$) source 82, a valve 84 arranged in a dry fluid pipeline 83 connecting the nozzle 81 with the source 82, a filter 85 and a $N_2$-temperature regulator 86. The secondary side of the $N_2$-temperature regulator 86 in the pipeline 83 is connected with a branch pipeline (not shown) diverged from an IPA pipeline (also not shown), through a switching valve 87. As similar to pure water nozzle 71, the dry fluid nozzle 81 is adapted so as to occupy a position outside the inner chamber 23 and also inside the outer chamber 24. When the inner cylinder 25 retreat to the stand-by position and the outer cylinder 26 is moved to a position surrounding the rotor 21 and the wafers W thereby to define the outer chamber 24, the nozzle 81 is positioned inside the outer chamber 24 to supply the wafers W with a mixture of $N_2$-gas and IPA in the form of mist. In this case, after drying the wafers W by the mixture of $N_2$-gas and IPA, they are further dried by only $N_2$-gas. Although the mixture forms the dry fluid in the above embodiment, the mixture may be replaced with only $N_2$-gas in the modification.

Note, the CPU 30 controls the pump 16 of the chemical supply unit 50, the IPA supply unit 60, the pure water supply unit 70 and the dry fluid supply unit 80, the first-seventh switching valves 15a to 15g of the chemical reservoir 52, the $N_2$-temperature regulator 86, the IPA valve (not shown) and the switching valve 87 (see FIG. 1).

The operation of the cleaning-and-drying apparatus of the invention will be described below. First, the wafer delivery hand 29 receives the wafers W, which have been transported from a loading/unloading side (not shown) of the apparatus by a wafer transfer chuck arm, or the wafers in the wafer carrier. Subsequently, the wafer delivery hand 29 rises to insert the wafers W into the rotor 21 having the movable carrying rods 32 opened outward and further delivers the wafers W to the immovable carrying rods 31 and the closed movable carrying rods 32. After this delivery, the not-shown locking mechanism is activated to lock the movable carrying rods 32. Thereafter, the wafer delivery hand 29 is moved to the original position.

Upon positioning of the wafers W in the rotor 21, the inner cylinder 25 and the outer cylinder 26 are moved to a position to surround the wafers W thereby to accommodate them in the inner chamber 23. In this state, supply the chemical liquid to the wafers W thereby performing a chemical processing (first processing). At this chemical processing (first processing), the second switching valve V2 in the pure water pipeline 111 and the valves V5, V6 in the drain pipeline 120 are closed, while the first switching valve V1 and the valve V4 in the circulating pipeline of the unit 100 are together opened and the circulating pump 103 is started to drive. Then, the temperature-adjustment medium (hot water) heated up to the temperature of the chemical liquid (e.g. approx. 80° C.) by the heater 4 circulates in the meandering pipe 91 of the case heat exchanger 90, so that the inner cylinder 25 and the interior of the inner chamber 23 (first processing chamber) are controlled to be equal to the chemical liquid in temperature. Therefore, it is possible to prevent the temperature of the chemical liquid, which has been supplied from the chemical supply nozzle 51 to the wafers W, from falling within a range of −5° C., while the conventional process using no case heat exchanger exhibits the fall of −10° C. Further, in case of circulating the chemical liquid lowered in temperature, it is possible to shorten the temperature-recovery time to half (5 minutes) of the recovery time (10 minutes) of the conventional process employing no case heat exchanger 90. As the method of supplying the chemical liquid to the wafers W through the chemical supply nozzle 51, there are a method of ejecting the chemical liquid simply, a method of spraying the chemical liquid in mist and so on.

Note, in the process mentioned above, the supply of the temperature adjustment medium to the cylinder and the supply of the chemical liquid to the processing chamber start at the same time. However, it is possible that the supply of the temperature adjustment medium start before the supply of the chemical liquid. Adopting this process, it is possible that when the supply of the chemical liquid to the processing chamber start, the temperature of the processing chamber has been already adjusted to the same temperature as the chemical liquid.

Note, according to this chemical process, it is carried out to supply the chemical liquid for a predetermined time, for example, dozens of seconds while rotating the rotor 21 and the wafers W at a low speed (e.g. 1–500 rpm). Then, the supply of chemical liquid is stopped and subsequently, the rotor 21 and the wafers W are rotated at a high speed (e.g. 100–3000 rpm) for several seconds in order to remove the chemical liquid from the wafer surfaces. By repeating this chemical supply process and the chemical removal process for several times to thousands times, the chemical process will be completed.

As for the above-mentioned chemical processing (1st. processing), under the normal processing condition where the chemical liquid is stored in the inner tank 1 and the outer tank 2 alike, the chemical liquid stored in the outer tank 2 is used as the chemical liquid to be supplied at first. In detail, since the supply pump 16 is operated while opening the second, sixth, seventh and the fourth switching valves 15b, 15f, 15g, 15d, the chemical liquid in the outer tank 2 flows through the second pipeline 14b, the main pipeline 14c, the by-pass pipeline 19 and again the main pipeline 14c in order and subsequently enters into the processing chamber. During this current, the chemical liquid via the supply pump 16 is filtered by the filter 19a thereby to remove impurities, etc. contained in the liquid. The chemical liquid, which has been firstly used for a predetermined period, is abrogated through the first drainpipe 42 finally. As for the other chemical liquid, it is provided for the process for a predetermined period and thereafter, returned into the outer tank 2 for subsequent circulation.

After the chemical liquid has been supplied for circulation for the predetermined period, a new chemical liquid in the inner tank 1 is supplied into the processing chamber thereby to complete the chemical processing (1st processing). When feeding the fresh chemical liquid in the inner tank 1 to the side of the processing chamber, the second, sixth and the seventh switching valves 15b, 15f, 15g are opened while opening the first, third and the fourth switching valves 15a, 15c, and 15d. In this state, the operation of the pump 16 allows the fresh chemical liquid in the inner tank 1 to be fed into the processing chamber through the first pipeline 14 and the main pipeline 14c alike. During this flowing, the fresh chemical liquid via the pump 16 is filtered by the filter 17 thereby to remove impurities, etc. contained in the liquid. Further, the fresh chemical liquid, which has been provided in the previous processing and subsequently remained in the main pipeline 14c, is filtered by the filter 17, together with the next new chemical liquid. The so-supplied new chemical liquid is stored in the outer tank 2 via the return pipeline 56.

The above explanation is concerned with the normal process where the chemical liquid is stored in the inner tank 1 and the outer tank 2. While, in a vacant condition where no chemical liquid is stored in the inner tank 1 and the outer tank 2, the chemical process is perfumed as follows.

First of all, while opening the chemical valve 3a, it is carried out to supply the chemical liquid from the chemical source 3 into the inner tank 1. Simultaneously, a predetermined quantity of chemical liquid is supplied from the inner tank 1 to outer tank 2 through the overflow pipeline 5. In the early stage of processing, the new chemical liquid in the outer tank 2 is supplied into the processing chamber to carry out the first chemical process. Subsequently, as similar to the above-mentioned normal chemical process, after the circulatory supply of the chemical liquid in the outer tank 2, the new chemical liquid in the inner tank 1 is supplied to the processing chamber, completing the chemical process.

Note, at the chemical processing (1st. processing), the chemical liquid used in the chemical processing is fed to the drain port 41. Thereafter, owing to the operation of the switching valve (not shown), the liquid is returned through the return pipeline 56 to the chemical reservoir 52 for circulation or discharged into the first drainpipe 42. While, a vapor generated from the chemical liquid is discharged through the first exhaust port 43 and the first exhaust pipe 44.

After completing the chemical processing (1st. processing) in the above way, the operation of the supply pump 16 is stopped to cease the supply of chemical liquid. Simultaneously, the operation of the circulating pump 103 is also stopped to cease the supply of temperature-adjustment medium (hot water). Next, the first switching valve V1 and the valve V4 in the circulating pipeline 101 are together closed while opening the second switching valve V2 in the pure water pipeline 111 and the valve V5 in the drain pipeline 120, so that the temperature-adjustment coolant (pure water) of the room temperature (e.g. 23° C.) is supplied from the pure water source 111 into the meandering pipe 91 of the case heat exchanger 90 thereby to cool the inner cylinder 25 and the interior of the inner chamber 23 (i.e. the first processing chamber) radically. Then, the coolant flowing out of the meandering pipe 91 is discharged to the outside through the drain pipeline 120. Under condition that the inner cylinder 25 and the interior of the inner chamber 23 are cooled down to the room temperature (e.g. 23° C.), the wafers W in the inner chamber 23 are rotated at a low speed (e.g. 1–500 rpm) and IPA is also supplied to the wafers W through the chemical nozzle 51 of the IPA supply unit 60 for a predetermined time, for example, dozens of seconds. After completing to supply IPA, the rotor 21 and the wafers W are rotated at a high speed (e.g. 100–3000 rpm) for several seconds in order to remove IPA adhering to the wafer surfaces. By repeating this IPA supply process and the IPA removal process for several times to thousands times, the chemical removal process (2nd processing) will be finished. Also in this chemical removal process, as similar to the above-mentioned chemical process, it is executed to use IPA stored in the circulating tank (not shown) at first. This IPA is abrogated and thereafter, another IPA stored in the not-shown supply tank is supplied for circulation. At the end of the chemical removal, there is used a new IPA, which has been supplied from the IPA source into the supply tank, thereby completing the chemical removal process. In connection with the above-mentioned supply of coolant, it is noted that it is not always required to cool the inner chamber 23 so long as being provided with the interior under the temperature at the chemical removal process (2nd. process).

After the chemical process and the rinsing process are concluded, the inner cylinder 25 makes a retreat to the stand-by position, so that the rotor 21 and the wafers W are surrounded by the outer cylinder 26, that is, the outer chamber 24. Therefore, even if the liquids drop from the processed wafers W, they can be received by the outer chamber 24. In this state, the rinsing liquid, for example, pure water is supplied to the rotating wafers W through the pure water nozzle 71 for rinsing. Both pure water and IPA for rinsing and sequent removing are discharged from the second drainpipe 46 through the second drain port 45. Additionally, the gas generated in the outer chamber 24 is discharged to the outside through the second exhaust port 48 and the second exhaust pipe 49.

After carrying out the rinsing process for a predetermined time, it is executed to supply the rotating wafers W accommodated in the outer chamber 24, with the mixture of $N_2$-gas and IPA supplied from the $N_2$-gas source 81 and the IPA source 61 both forming the dry fluid supply unit 80. Thus, by removing the pure water adhering to the wafer surfaces, the wafers W and the interior of the outer chamber 24 can be dried. Further, by supplying $N_2$-gas only to the wafers W after the drying process by the mixture of $N_2$-gas and IPA, it is possible to dry the wafers W and the interior of the outer chamber 21 more effectively.

After completing the chemical process, the chemical removal process, the rising process and the drying process for the wafers W in the above way, the outer cylinder 26 retreats to the stand-by position outside the inner cylinder 25, while the wafer delivery hand 29 rises and moves to a position below the rotor 21 and the not-shown delocking unit operates to retreat the movable carrying rods 32 from the position to push the wafers W. Then, the wafer delivery hand 29 receives the wafers W supported by the immovable carrying rods 31 and further moves to the downside of the processing apparatus 20. The wafers W being moved underside the processing apparatus are received by the wafer transfer chuck to transport the wafers W to the loading/unloading part or accommodate them in the wafer carrier and thereafter, they are transported outside the apparatus.

Note, although there is provided the single heater 4 as the liquid-temperature regulator in the above-mentioned embodiment, the apparatus may be provided with a plurality of thermal insulating units establishing the same temperature or different temperatures in the modification. In this case, it allows the apparatus to cope with a plurality of temperatures of the processing liquid, being advantageous in processing the wafers with the plurality of processing liquids.

Figure 7:
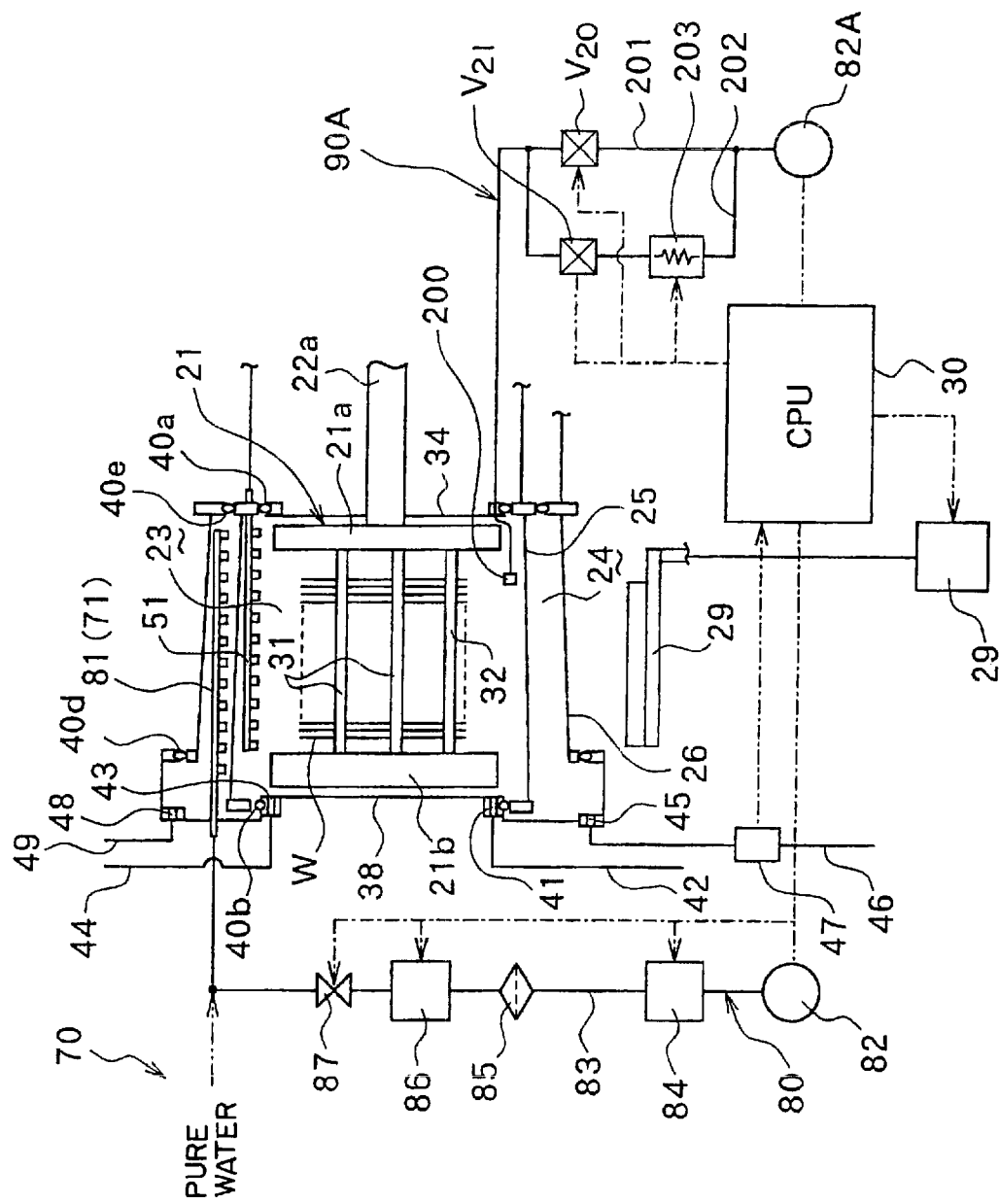
FIG. 7 is a schematic structural view showing another form of the temperature controller for the processing chamber of the invention.

Further, although the case heat exchanger 90 employs the hot water as the temperature-adjustment medium, the object to be used by the regulator 90 is not limited to the hot water only. FIG. 7 illustrates another case heat exchanger 90A which employs $N_2$-gas as the temperature-adjustment medium. In the shown apparatus, a $N_2$ nozzle 200 is arranged in the inner chamber 23. The $N_2$ nozzle 200 is connected to a $N_2$ source 82A through a first pipeline 201 equipped with a switching valve V20 and a second pipeline 202 equipped with a switching valve V21 and a hot generator 203.

According to the so-constructed case heat exchanger 90A, the switching operation of the valves V20, V21 allows hot $N_2$-gas or cool $N_2$-gas (e.g. 23° C.) to be supplied to the $N_2$ nozzle 200 selectively, so that the interior of the inner chamber 23 (processing chamber) can be controlled in temperature. Note, the operation of the switching valves V20, V21 are controlled by the CPU 30

In this embodiment of FIG. 7, other elements similar to those of the previously-mentioned elements are indicated with the same reference numerals, respectively.

In place of the above supply of $N_2$-gas, there may be provided a heater outside the inner cylinder 25 to control the temperature of the processing chamber.

Although the above embodiment is related to the cleaning-and-drying apparatus for processing semiconductor wafers, the present invention is also applicable to the other apparatus for processing other substrates, such as LCD glass substrates. In connection, the invention is also applicable to the apparatus using other chemical liquids besides the chemical liquid of the embodiment. Of course, besides the cleaning-and-drying apparatus, the invention is applied to a liquid-processing apparatus using a processing liquid.

As mentioned above, the present invention with the above-mentioned constitution has effects as follows:

Since the medium supplier allows the temperature-adjustment medium to be supplied to the case heat exchanger outside the processing chamber, it is possible to flow the temperature-adjustment medium about the outer periphery of the processing chamber at the process to supply the object with the processing liquid of the designated temperature. Consequently, the processing chamber including the interior of the chamber is controlled to be of the temperature of the processing liquid, reducing the change in temperature of the processing liquid, such as lowering or rising. Further, in case of circulating the processing liquid, it is possible to shorten a time for recovering the temperature of the processing liquid. Thus, the processing efficiency can be improved.

Since the switching operation of the switching means allows the temperature-adjustment medium or coolant to be selectively supplied to the case heat exchanger outside the processing chamber, it is possible to supply the case heat exchanger with the temperature-adjustment medium or the temperature-control cooling medium selected by the switching operation of the switching means. Therefore, after completing the first process where the processing chamber including the interior of the chamber is controlled to be of the temperature of the processing liquid, it is possible to perform the second process to supply another processing liquid to the object while the processing chamber and the interior are together cooled by the flow of temperature-control cooling medium. Thus, it is possible to facilitate the establishment of respective designated temperatures for different processes and also accomplish the different processes continuously and effectively.

Since the interior of the processing chamber is adjusted in temperature by the case heat exchanger arranged about the outer periphery of the processing chamber, it is possible to minimize the temperature variations (lowering, rising, etc.) of the processing liquid in case of supplying the rotating object with the processing liquid of a designated temperature. Furthermore, in case of the supply of the processing liquid in circulation, then the above constitution allows a time for recovering the temperature of the processing liquid to be shortened.

Since the temperature-adjustment medium flowing in the medium-circulating pipeline is adjusted in temperature by a liquid-temperature regulator for controlling the temperature of the processing liquid in the liquid supplier, it is possible to equalize the temperature of the processing liquid at processing to the temperatures of the processing chamber and the interior of the chamber with ease.

Since the medium supplier is equipped with the reservoir container, it is possible to store the temperature-adjustment medium in the container. Thus, without elongating the circulating pipeline excessively, it is possible to ensure the temperature-adjustment medium of a quantity required for the temperature control. Moreover, when using the liquid as the temperature-adjustment medium, it can be supplied to the temperature regulator upon removal of air in the medium.

Since, the liquid supplier comprises a liquid nozzle for ejecting the processing liquid into the processing chamber, the liquid reservoir for storing the processing liquid therein, the liquid supply pipeline for connecting the liquid reservoir with the liquid nozzle and the liquid-temperature regulator arranged in the liquid reservoir to control the temperature of the processing liquid stored in the liquid reservoir. Thus, the liquid-temperature regulator allows the processing liquid in the liquid reservoir to be controlled to a designated temperature. Additionally, it is possible to supply the processing liquid into the processing chamber through the liquid nozzle.

Since the liquid reservoir has the inner tank, the outer tank arranged outside the inner tank and also provided with the liquid-temperature regulator and the heat exchanger disposed between the outer tank and the inner tank and also connected with the medium-circulating pipeline of the medium supplier, it is possible to use the space for the apparatus effectively and also possible to equalize the temperature-adjustment medium with the processing liquid in temperature.

Since the processing liquid is supplied in circulation, it is possible to use the liquid effectively.

Since the meandering pipe and the spacer member are provided on the case, it is possible to transmit the heat of the temperature-adjustment medium or cooling medium flowing in the meandering pipe, to the outer face of the processing chamber and the interior of the chamber through the spacer member effectively.

Owing to the provision of the thermal insulating sheet on the meandering pipe of the case heat exchanger, the heat loss of the case heat exchanger can be restricted to enhance the thermal insulating effect furthermore, improving the temperature-control efficiency in addition to the above (9) effect, furthermore.

Since the temperature adjustment medium is supplied to the case, when the chemical liquid is supplied to the processing chamber, it is possible to flow the temperature-adjustment medium about the outer periphery of the processing chamber at the process to supply the object with the processing liquid of the designated temperature. Consequently, the processing chamber including the interior of the chamber is controlled to be of the temperature of the processing liquid, reducing the change in temperature of the processing liquid, such as lowering or rising. Further, in case of circulating the processing liquid, it is possible to shorten a time for recovering the temperature of the processing liquid. Thus, the processing efficiency can be improved.

When supplying the object with the processing liquid of the designated temperature, the case heat exchanger outside the processing chamber is operated to control the processing chamber and the interior in temperature. Subsequently, the supply of the processing liquid is stopped together with the stop of the case heat exchanger. Then, by supplying the object with another processing liquid for the second process, it is possible to facilitate the establishment of respective designated temperatures for different processes and also possible to accomplish the different processes continuously and effectively. In this case, by flowing the temperature-adjustment medium through the case heat exchanger, it is possible to improve the temperature-regulating efficiency.

Since the temperature-control cooling medium is supplied to the case heat exchanger to cool the processing chamber and the interior, it is possible to cool the processing chamber and the interior, which have been controlled to the designated temperature, with ease.

When supplying the object with the processing liquid of the designated temperature, the processing chamber is controlled in temperature. Subsequently, the supply of the processing liquid is stopped together with the stop of the case heat exchanger. Then, by supplying the object with another processing liquid for the second process while cooling the processing chamber controlled in temperature, it is possible to facilitate the establishment of respective designated temperatures for different processes and also possible to accomplish the different processes continuously and effectively.

Since the interior of the processing chamber is controlled to be of the temperature of the processing liquid, it is possible to reduce the change in temperature of the processing liquid furthermore, improving the processing efficiency.

Since the processing liquid is supplied to the object in rotation, it is possible to reduce the change in temperature of the processing liquid in supplying the rotating object with the processing liquid. Thus, the processing efficiency of the liquid processing method can be improved furthermore.

What is claimed is:

1. A liquid processing apparatus for applying processing liquid on an object to be processed, comprising:

a case;

a processing chamber defined by the case to accommodate the object therein;

a liquid supplier for supplying processing liquid to the object in the processing chamber;

a liquid temperature controller for controlling a temperature of the processing liquid in the liquid supplier;

a case heat exchanger provided to the case and through which temperature-adjustment medium adjusted in temperature is able to flow; and a medium supplier connected with the case heat exchanger to supply the temperature-adjustment medium to the case heat exchanger, the medium supplier having a medium-circulating pipeline passing through the case heat exchanger and a medium-circulating pump interposed in the medium-circulating pipeline;

wherein the liquid temperature controller controls a temperature of the temperature-adjustment medium in the medium supplier.

2. A liquid processing apparatus as claimed in claim 1, wherein the medium supplier is connected with the case heat exchanger through a switching device and wherein the medium supplier has a medium reservoir storing the temperature-adjustment medium therein, a coolant source from which the temperature-adjustment medium as coolant is to be supplied and a pump for circulating the temperature-adjustment medium through the medium-circulating pipeline.

3. A liquid processing apparatus as claimed in claim 2, further comprising a controller for controlling switching operation of the switching device.

4. A liquid processing apparatus as claimed in claim 1, wherein the liquid supplier comprises:

a liquid nozzle for ejecting the processing liquid into the processing chamber;

a liquid reservoir for storing the processing liquid therein; and a liquid supply pipeline for connecting the liquid reservoir with the liquid nozzle; and wherein the liquid-temperature controller is provided on the liquid reservoir to control temperature of the processing liquid stored in the liquid reservoir.

5. A liquid processing apparatus as claimed in claim 4, wherein the liquid reservoir has an inner tank, an outer tank arranged outside the inner tank and also provided with the liquid-temperature controller and a medium circulating pipeline disposed between the outer tank and the inner tank so as to transfer heat between the processing liquid in the outer tank and the temperature-adjustment medium in the medium circulating pipeline.

6. A liquid processing apparatus as claimed in claim 1, wherein the case heat exchanger has a meandering pipe arranged outside the case meanderingly and a spacer member disposed between the meandering pipe and an outer surface of the case;

the spacer member is made of heat conductive material; and the spacer member has a first surface being in contact with the meandering pipe and shaped to be a cylindrical sidewall so as to be in contact with an outer face of the meandering pipe and a second surface being in contact with an outer face of the case and shaped to be a cylindrical sidewall so as to be contoured along the outer surface of the case.

7. A liquid processing apparatus as claimed in claim 6, wherein the meandering pipe is overlaid with a thermal insulating sheet.

8. A liquid processing apparatus for applying processing liquid on an object to be processed, comprising:

a case;

a holder for holding the object rotatably;

a processing chamber surrounded by the case to accommodate the object and the holder therein;

a liquid supplier for supplying processing liquid to the object in the processing chamber; and a case heat exchanger provided to the case, wherein the processing chamber has a first processing chamber and a second processing chamber surrounding the first processing chamber;

the case having a first case surrounding the first processing chamber and a second case surrounding the second processing chamber;

the first case and the second case being constructed so as to be movable relatively; and the case heat exchanger being provided, at least, to the first case.

9. A liquid processing apparatus as claimed in claim 8, wherein temperature-adjustment medium adjusted in temperature is able to flow through the case heat exchanger.

10. A liquid processing apparatus as claimed in claim 8, further comprising a medium supplier for supplying the temperature-adjustment medium to the case heat exchanger, whereby the temperature-adjustment medium supplied from the medium supplier flows through the case heat exchanger.

11. A liquid processing method of applying a process on an object to be processed by supplying processing liquid to the object accommodated in a processing chamber surrounded by a case, the liquid processing method comprising:

adjusting a temperature of a temperature-adjustment medium by a liquid temperature controller in a liquid supplier, while adjusting a temperature of the processing liquid by the liquid temperature controller in the liquid supplier; and making the temperature-adjustment medium adjusted in temperature flow to an outer surface of the case by the liquid supplier, to control temperature of the processing chamber; at the time when the processing liquid is supplied to the object accommodated in the processing chamber.

12. A liquid processing method of applying a process on an object to be processed by supplying processing liquid to the object accommodated in a processing chamber surrounded by a case, the liquid processing method comprising:

adjusting a temperature of a temperature-adjustment medium by a liquid temperature controller in a liquid supplier, while adjusting a temperature of the processing liquid by the liquid temperature controller in the liquid supplier;

making a temperature-adjustment medium adjusted in temperature flow into a case heat exchanger provided to the case, while supplying the processing liquid adjusted in temperature to the liquid supplier, thereby to control temperature of the processing chamber, at the time of a first process when the processing liquid is supplied to the object accommodated in the processing chamber;

stopping to supply the processing liquid and stopping the flow of the temperature-adjustment medium in the case heat exchanger; and supplying the object with another processing liquid thereby to apply a second process on the object.

13. A liquid processing method as claimed in claim 12, further comprising the step of making the temperature of the processing chamber adjusted by supplying the temperature-adjustment medium, before the first process start.

14. A liquid processing method as claimed in claim 12, further comprising the step of making a temperature-adjustment medium for cooling pass through the case heat exchanger thereby to cool the processing chamber.

15. A liquid processing method of applying a process on an object to be processed by supplying processing liquid to the object accommodated in a processing chamber, the liquid processing method comprising:

adjusting a temperature of a temperature-adjustment medium by a liquid temperature controller in a liquid supplier, while adjusting a temperature of the processing liquid by the liquid temperature controller in the liquid supplier;

controlling temperature of the processing chamber by making the temperature-adjustment medium adjusted in temperature flow into a case heat exchanger provided to the case, at a first process to supply the processing liquid adjusted in a predetermined temperature to the object accommodated in the processing chamber;

stopping the supply of the processing liquid and simultaneously stopping the control of temperature of the processing chamber;

cooling an interior of the processing chamber adjusted in temperature; and supplying the object with another processing liquid thereby to apply a second process on the object.

16. A liquid processing method as claimed in claim 15, wherein the processing chamber is controlled so as to have the same temperature as the predetermined temperature of the processing liquid.

17. A liquid processing method as claimed in claim 15, wherein the processing liquid is supplied to the rotating object.

* * * * *